(12) United States Patent
Kim

(10) Patent No.: US 10,605,864 B2
(45) Date of Patent: Mar. 31, 2020

(54) POWER GATING CONTROL SYSTEM AND CONTROL METHOD THEREOF

(71) Applicant: SK hynix Inc., Icheon-si, Gyeonggi-do (KR)

(72) Inventor: Woongrae Kim, Icheon-si (KR)

(73) Assignee: Sk hynix Inc., Icheon-si, Gyeonggi-do (KR)

( * ) Notice: Subject to any disclaimer, the term of this patent is extended or adjusted under 35 U.S.C. 154(b) by 51 days.

(21) Appl. No.: 15/957,532

(22) Filed: Apr. 19, 2018

(65) Prior Publication Data
US 2019/0162781 A1    May 30, 2019

(30) Foreign Application Priority Data
Nov. 27, 2017  (KR) .................. 10-2017-0159510

(51) Int. Cl.
*G01R 31/28* (2006.01)
*G01R 31/3177* (2006.01)
*H03K 19/00* (2006.01)
*H03K 17/687* (2006.01)

(52) U.S. Cl.
CPC ....... *G01R 31/3177* (2013.01); *H03K 17/687* (2013.01); *H03K 19/0013* (2013.01)

(58) Field of Classification Search
CPC .......... G01R 31/3177; H03K 19/0013; H03K 17/687
See application file for complete search history.

(56) References Cited

U.S. PATENT DOCUMENTS 8,266,482 B2 *  9/2012  Tune ............... H04L 1/0001
                                                  714/712
2013/0069690 A1 *  3/2013  Kim ................ H03K 19/0016
                                                  326/33

* cited by examiner

*Primary Examiner* — Samir W Rizk
(74) *Attorney, Agent, or Firm* — William Park & Associates Ltd.

(57) ABSTRACT

A power gating control system may be provided. The power gating control system may include a semiconductor apparatus including a logic circuit block which is coupled with a power supply terminal through a power gating transistor. The power gating control system may include a tester configured to control the semiconductor apparatus such that a test for the logic circuit block is performed by using test data while changing a body bias value of the power gating transistor, and update a body bias value satisfying a predetermined test condition, in the semiconductor apparatus.

11 Claims, 5 Drawing Sheets

POWER GATING CONTROL SYSTEM AND CONTROL METHOD THEREOF

CROSS-REFERENCES TO RELATED APPLICATION

The present application claims priority under 35 U.S.C. § 119(a) to Korean application number 10-2017-0159510, filed on Nov. 27, 2017, in the Korean Intellectual Property Office, which is incorporated herein by reference in its entirety.

BACKGROUND

1. Technical Field

Various embodiments generally relate to a semiconductor circuit, and, more particularly, to a power gating control system and a control method thereof.

2. Related Art

Electronics, for example, portable electronics are trending toward a reduction in size and weight, whereas the function blocks built into the portable electronics are increasing in number.

In particular, since the portable electronics operate based on a limited power source, i.e., a battery, there is a need to reduce the power, while in a standby mode, that is unnecessarily consumed by the function blocks.

To this end, in the portable electronics, a power gating technique for preventing power from being unnecessarily supplied to the function blocks in the standby mode is applied.

Therefore, with regards to electronics in this art, the development of a power gating technique capable of optimizing the operation performance and current consumption of these electronics is in demand.

SUMMARY

In an embodiment, a power gating control system may be provided. The power gating control system may include a semiconductor apparatus including a logic circuit block which is coupled with a power supply terminal through a power gating transistor. The power gating control system may include a tester configured to control the semiconductor apparatus such that a test for the logic circuit block may be performed by using test data while changing a body bias value of the power gating transistor, and update a body bias value satisfying a predetermined test condition, in the semiconductor apparatus.

In an embodiment, a power gating control system may be provided. The power gating control system may include a semiconductor apparatus including a plurality of logic circuit blocks which are coupled with a power supply terminal through a plurality of power gating transistors, respectively, and a plurality of switches which are respectively coupled between coupling nodes of the plurality of power gating transistors and the plurality of logic circuit blocks. The power gating control system may include a tester configured to control the semiconductor apparatus such that a test for the plurality of logic circuit blocks is performed by using test data while performing at least one of an on/off combination change of the plurality of switches and a body bias change of the plurality of power gating transistors, and update a first body bias value and a first on and off (on/off) combination satisfying a predetermined test condition, in the semiconductor apparatus.

In an embodiment, a power gating control method of a semiconductor apparatus including a plurality of logic circuit blocks which are coupled with a power supply terminal through a plurality of power gating transistors, respectively, and a plurality of switches which are coupled between coupling nodes of the plurality of power gating transistors and the plurality of logic circuit blocks may include. The method including a body bias optimizing act of determining whether it is a pass or fail (pass/fail), by performing a test for the plurality of logic circuit blocks while changing a body bias of the plurality of power gating transistors, and setting the body bias of the plurality of power gating transistors, to a body bias value at the time of a final pass.

DETAILED DESCRIPTION

Hereinafter, a power gating control system and a control method thereof will be described below with reference to the accompanying drawings through various examples of embodiments.

Various embodiments may be directed to a power gating control system and a control method thereof, capable of optimizing the operation performance and current consumption of electronics for which a power gating technique is applied.

Further, the logic levels of the signals may be different from or the opposite of those described. For example, a signal described as having a logic "high" level may alternatively have a logic "low" level, and a signal described as having a logic "low" level may alternatively have a logic "high" level.

Figure 1:
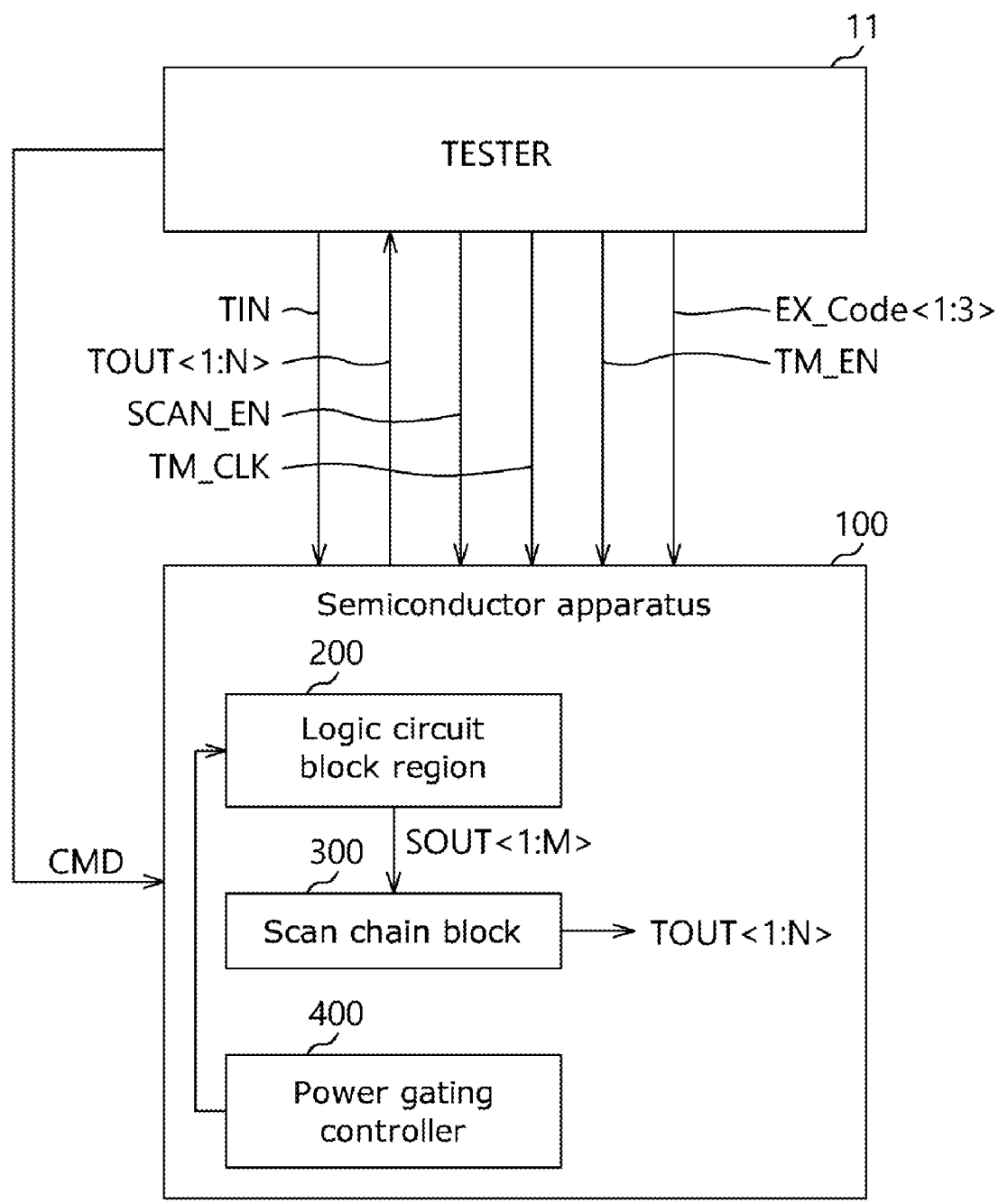
FIG. 1 is a diagram illustrating a representation of an example of the configuration of a power gating control system in accordance with an embodiment.

As illustrated in FIG. 1, a power gating control system 10 in accordance with an embodiment may include a tester 11 and a semiconductor apparatus 100.

The semiconductor apparatus 100 may be any one among a CPU, a GPU, and a memory chip.

The semiconductor apparatus 100 may include a logic circuit block region 200, a scan chain block 300 and a power gating controller 400.

The semiconductor apparatus 100 may perform a scan test-related operation according to a command CMD provided from the tester 11.

Figure 2:
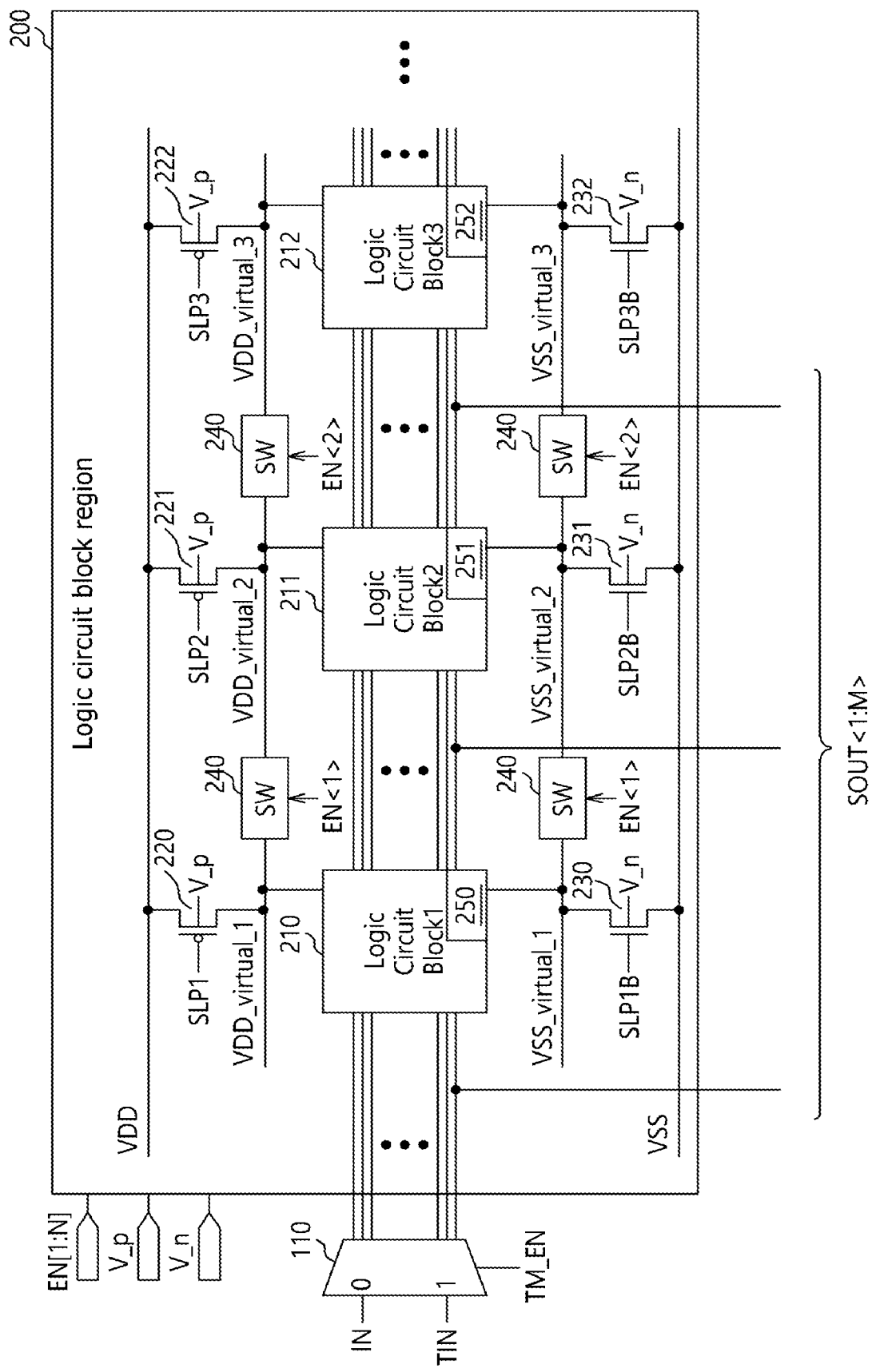
FIG. 2 is a diagram illustrating a representation of an example of the configuration of the logic circuit block region illustrated in FIG. 1.
Figure 3:
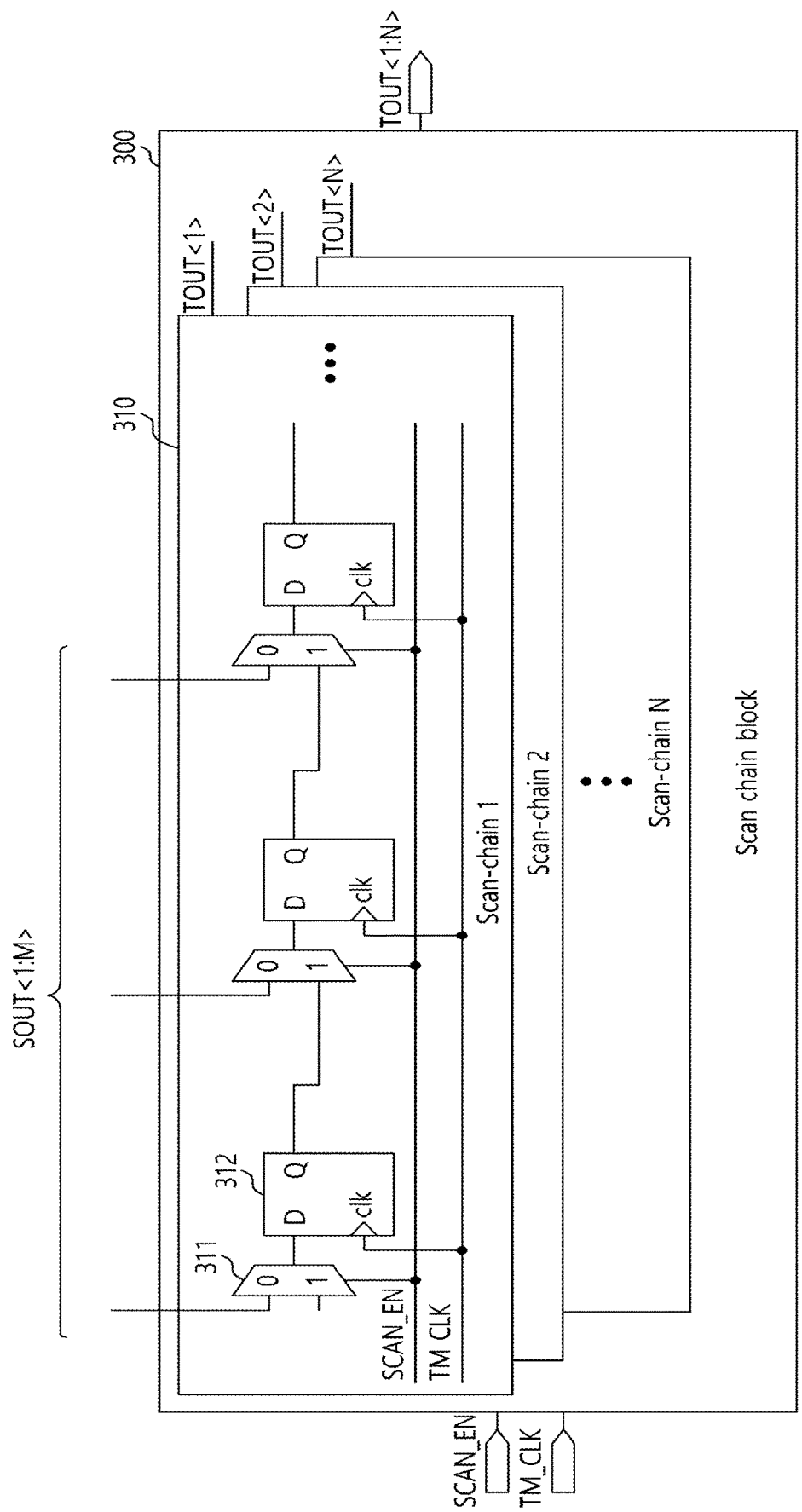
FIG. 3 is a diagram illustrating a representation of an example of the configuration of the scan chain block illustrated in FIG. 1.
Figure 4:
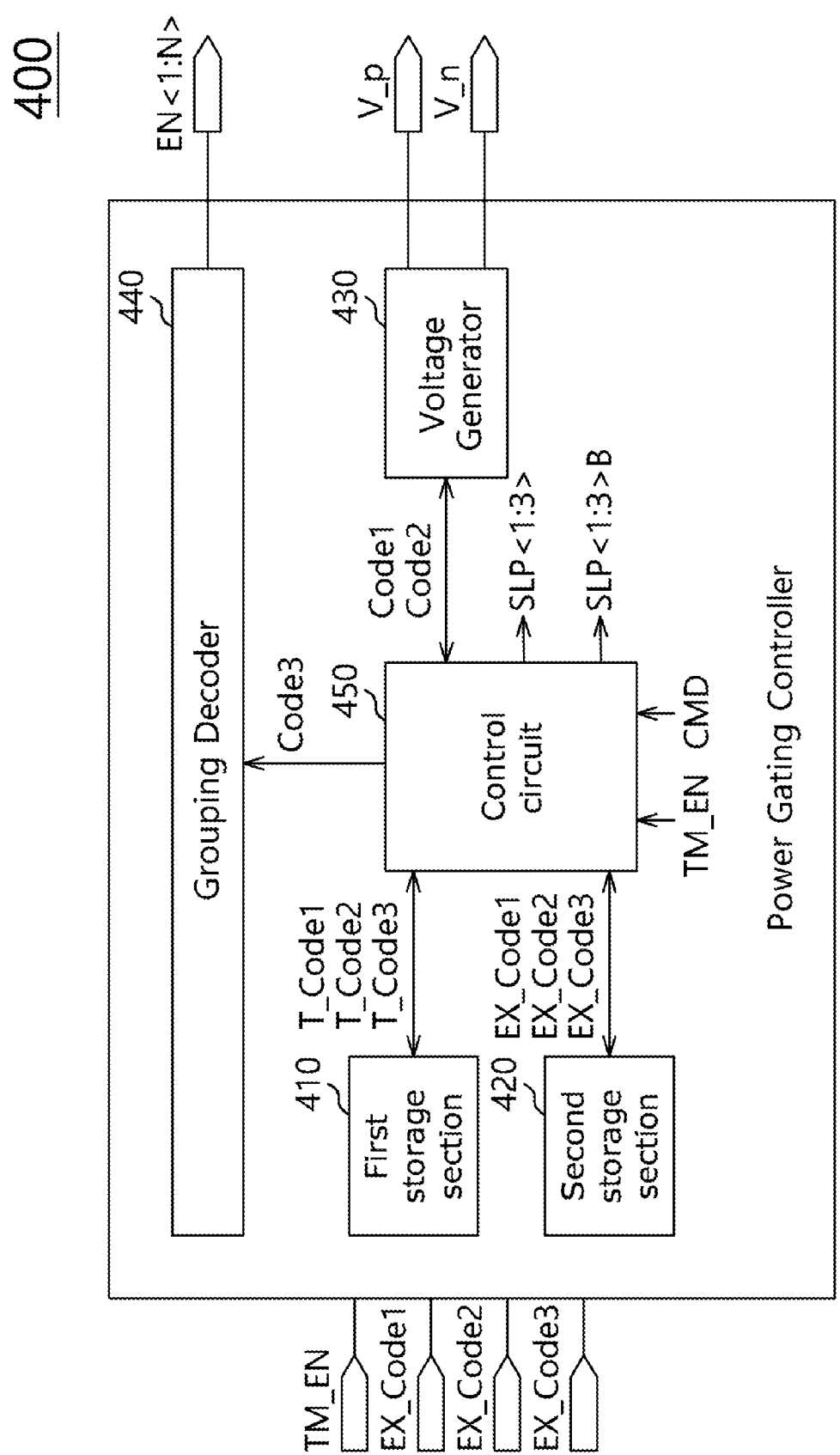
FIG. 4 is a diagram illustrating a representation of an example of the configuration of the power gating controller illustrated in FIG. 1.
Figure 5:
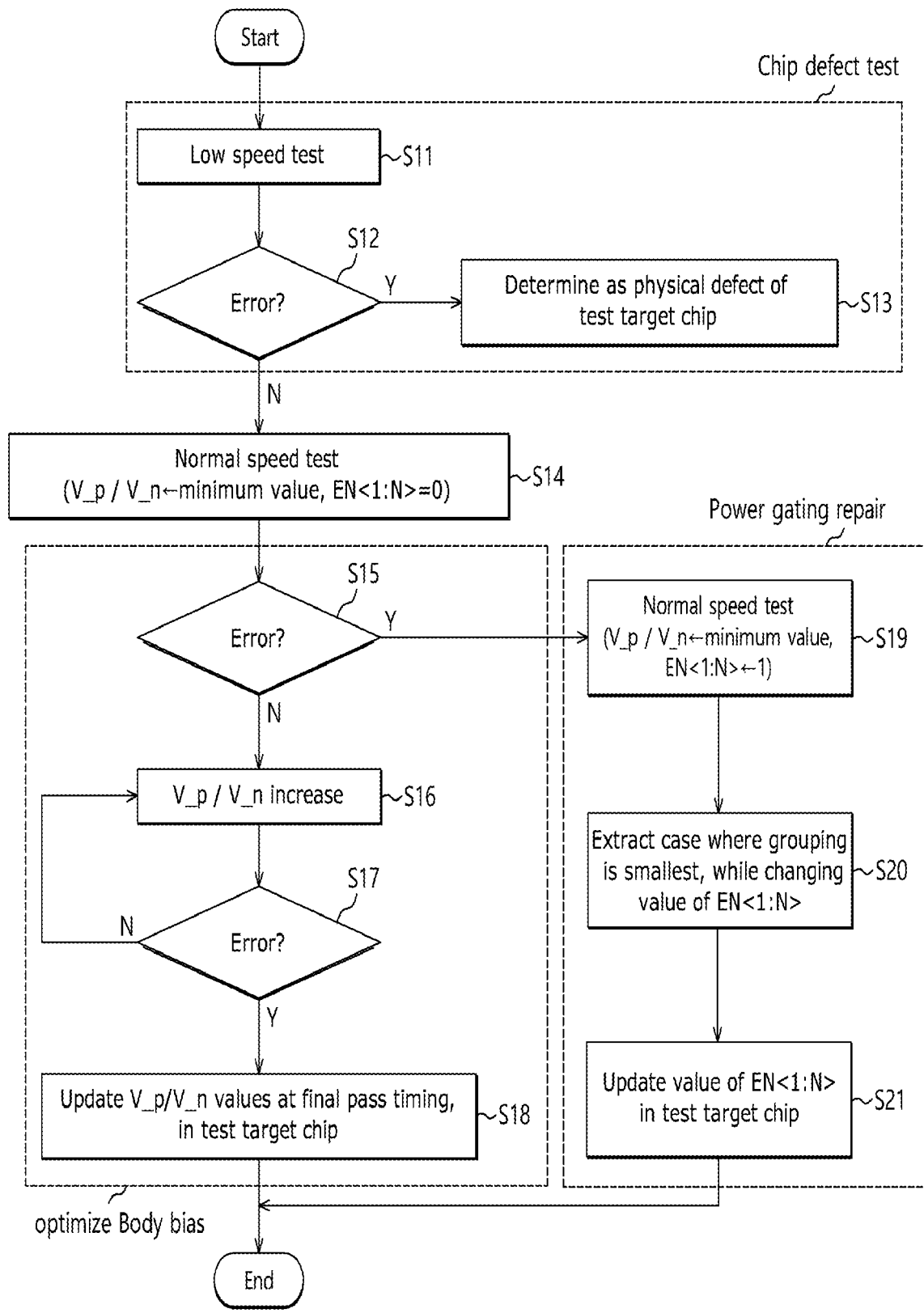
FIG. 5 is a representation of an example of a flow chart to assist in the explanation of a power gating control method in accordance with an embodiment.

The logic circuit block region 200 may include a plurality of logic circuit blocks and circuit components for the power gating of the plurality of logic circuit blocks, for example, a plurality of power gating transistors for cutting off the power supplied to the plurality of logic circuit blocks in a standby mode and a plurality of switches for grouping the plurality of logic circuit blocks for a stable operation. While the circuit components are not illustrated in FIG. 1, they will be described later with reference to other drawings (FIGS. 2 to 4).

The plurality of logic circuit blocks of the logic circuit block region 200 may receive test data TIN, and output the signals passed via respective logic circuits, as scan data SOUT<1:M>.

The scan chain block 300 may receive the scan data SOUT<1:M>, perform a scan test, and output test result data TOUT<1:N>.

The power gating controller 400 may generate code signals for controlling the plurality of power gating transistors and the plurality of switches of the logic circuit block region 200 in the process of the scan test, and may store the code signals updated by the tester 11 according to a scan test result and accordingly control the plurality of power gating transistors and the plurality of switches in a normal mode.

The tester 11 may provide the command CMD for controlling the scan test, the test data TIN, a scan enable signal SCAN_EN, a test clock signal TM_CLK and a test mode signal TM_EN to the semiconductor apparatus 100, and may provide code signals EX_Code<1:3> to the semiconductor apparatus 100 according to the provided test result data TOUT<1:N>.

As illustrated in FIG. 2, the logic circuit block region 200 may include a plurality of logic circuit blocks 210, 211, 212, . . . and circuit components for the power gating of the plurality of logic circuit blocks 210, 211, 212, . . . , i.e., a plurality of first power gating transistors 220, 221, 222 ~, a plurality of second power gating transistors 230, 231, 232 ~ and a plurality of switches (SW) 240.

Each of the plurality of logic circuit blocks 210, 211, 212, . . . may include a plurality of logic circuits. In an embodiment, for example, the plurality of logic circuit blocks 210, 211, 212, . . . may each respectively include a plurality of logic circuits which are coupled in common with a power gating transistor. For example, logic circuit block1 210 may include a plurality of logic circuits 250 which are coupled in common with the power gating transistor 220. For example, logic circuit block2 211 may include a plurality of logic circuits 251 which are coupled in common with the power gating transistor 221. For example, logic circuit block 212 may include a plurality of logic circuits 252 which are coupled in common with the power gating transistor 222.

The plurality of logic circuits as a circuit block performing an intrinsic function may be referred to as a function block.

The plurality of logic circuit blocks 210, 211, 212, . . . may be coupled with a power supply terminal VDD through the plurality of first power gating transistors 220, 221, 222 ~, respectively, and may be coupled with a ground terminal VSS through the plurality of second power gating transistors 230, 231, 232 ~, respectively.

The plurality of logic circuits of each of the plurality of logic circuit blocks 210, 211, 212, . . . , for example, the plurality of logic circuits of the logic circuit block 210 may share one first power gating transistor 220 and one second power gating transistor 230.

The first power gating transistor 220 may be configured as a PMOS type transistor, be coupled with the power supply terminal VDD through the source terminal thereof, and be coupled with the logic circuit block 210 through the drain terminal thereof.

Standby mode signals SLP<1:3> which are logic high in the standby mode of the semiconductor apparatus 100 may be inputted to the gate terminals, respectively, of the plurality of first power gating transistors 220, 221, 222 ~.

Signals SLP<1:3>B generated by inverting the standby mode signals SLP<1:3> may be inputted to the gate terminals, respectively, of the plurality of second power gating transistors 230, 231, 232 ~.

The second power gating transistor 230 may be configured as an NMOS type transistor, be coupled with the ground terminal VSS through the source terminal thereof, and be coupled with the logic circuit block 210 through the drain terminal thereof.

Also, while not illustrated, a control signal which is logic low in the standby mode of the semiconductor apparatus 100 may be inputted to the gate terminal of the second power gating transistor 230.

Therefore, the plurality of first power gating transistors 220, 221, 222 ~ and the plurality of second power gating transistors 230, 231, 232 ~ may be turned off in the standby mode of the semiconductor apparatus 100, and may cut off the power supplied to the plurality of logic circuit blocks 210, 211, 212, . . . .

The bulk terminals of the plurality of first power gating transistors 220, 221, 222 ~ may be controlled by a first body bias V_p, and the bulk terminals of the plurality of second power gating transistors 230, 231, 232 ~ may be controlled by a second body bias V_n.

As will be described later, as the first body bias V_p and the second body bias V_n become high, that is, the absolute values thereof increase, the power cutoff capability of the transistors in the standby mode may be improved, but power supply performance may be degraded in the normal mode. Therefore, in this consideration, an embodiment is direct to finding and applying optimal body bias values capable of satisfying both.

The plurality of switches 240 may be respectively coupled between coupling nodes VDD_virtual_1, VDD_virtual_2, VDD_virtual_3 ~ and VSS_virtual_1, VSS_virtual_2, VSS_virtual_3 ~ of the plurality of first and second power gating transistors 220, 221, 222 ~ and 230, 231, 232 ~ and the plurality of logic circuit blocks 210, 211, 212, . . . .

The plurality of switches 240 may be turned on or off (on/off) by grouping enable signals EN<1:N>.

As will be described later, in the case where the grouping enable signals EN<1:N> are set to a minimum value, that is, all bits are set to logic low, each of the plurality of logic circuit blocks 210, 211, 212, . . . may be controlled by a pair of power gating transistors, and in this case, operation efficiency may be maximized.

The plurality of first and second power gating transistors 220, 221, 222 ~ and 230, 231, 232 ~ may have respective differences in characteristic, and accordingly, desired operation characteristics may not be achieved.

By controlling the plurality of switches 240 by using the grouping enable signals EN<1:N>, an operation (hereinafter, referred to as grouping) in which some logic circuit blocks selected among the plurality of logic circuit blocks 210, 211, 212, . . . share power gating transistors becomes possible, and thus, a degradation in power supply performance may be repaired through the grouping. Therefore, the embodiment is directed to fining an optimum grouping combination.

A multiplexer 110 may provide normal data IN to the plurality of logic circuit blocks 210, 211, 212, . . . when the test mode signal TM_EN is a deactivation level (logic low), and may provide the test data TIN to the plurality of logic circuit blocks 210, 211, 212, . . . when the test mode signal TM_EN is an activation level (logic high).

The data transmitted via the plurality of logic circuit blocks 210, 211, 212, . . . may be provided as the scan data SOUT<1:M> to the scan chain block 300.

As illustrated in FIG. 3, the scan chain block 300 may include a plurality of scan chains 310.

Each scan chain 310 may include scan units each of which is comprised of a multiplexer 311 and a flip-flop 312.

The multiplexer 311 may select and output the data of a previous scan unit or a signal bit allocated thereto among the scan data SOUT<1:M>, depending on the scan enable signal SCAN_EN.

The flip-flop 312 may latch the output of the multiplexer 311 depending on the test clock signal TM_CLK.

The outputs of the final scan units of the plurality of scan chains 310 may be outputted as the test result data TOUT<1:N>.

As illustrated in FIG. 4, the power gating controller 400 may include a first storage section 410, a second storage section 420, a voltage generator 430, a grouping decoder 440, and a control circuit 450.

The first storage section 410 may store a first code group T_Code1, T_Code2 and T_Code3.

In the first code group T_Code1, T_Code2 and T_Code3, T_Code1 and T_Code2 are digital codes for setting the values of the first body bias V_p and the second body bias V_n, respectively, and T_Code3 is a digital code for setting the value of the grouping enable signals EN<1:N>.

The first storage section 410 may store various values for each of the digital codes T_Code1, T_Code2 and T_Code3 in the first code group T_Code1, T_Code2 and T_Code3.

The second storage section 420 may store the code signals provided from the tester 11, that is, a second code group EX_Code1, EX_Code2 and EX_Code3.

In the second code group EX_Code1, EX_Code2 and EX_Code3, EX_Code1 and EX_Code2 are digital codes for setting the values of the first body bias V_p and the second body bias V_n, respectively, and EX_Code3 is a digital code for setting the value of the grouping enable signals EN<1:N>.

Each of the first storage section 410 and the second storage section 420 may be configured by a register or a fuse set.

The voltage generator 430 may generate the first body bias V_p and the second body bias V_n as different values depending on first and second body bias codes Code1 and Code2. In an embodiment, the voltage generator 430 may be implemented with software, hardware, or any combination thereof.

The grouping decoder 440 may decode a grouping code Code3 and thereby generate the grouping enable signals EN<1:N>. In an embodiment, the grouping decoder 440 may be implemented with software, hardware, or any combination thereof.

The control circuit 450 may output the first and second body bias codes Code1 and Code2 and the grouping code Code3 by selecting values corresponding to the command CMD with respect to the respective digital codes of the first code group T_Code1, T_Code2 and T_Code3 in a test mode, that is, when the test mode signal TM_EN is activated.

The control circuit 450 may output the first and second body bias codes Code1 and Code2 and the grouping code Code3 by selecting values corresponding to the command CMD with respect to the respective digital codes of the second code group EX_Code1, EX_Code2 and EX_Code3 in the normal mode, that is, when the test mode signal TM_EN is deactivated. In an embodiment, the control circuit 430 may be implemented with software, hardware, or any combination thereof.

The control circuit 450 may generate the standby mode signals SLP<1:3> and the inverted signals SLP<1:3>B of the standby mode signals SLP<1:3> by determining the standby mode of the semiconductor apparatus 100 through the command CMD.

Hereafter, a power gating control method in accordance with an embodiment will be described with reference to FIGS. 1 to 5.

A power gating control in accordance with an embodiment may include a chip defect test process, a body bias optimization process and a power gating repair process.

First, as the chip defect test, the following steps S11 to S13 may be performed.

Although the chip defect test is not essential to the embodiments, it may serve as a test for checking a physical defect of a test target chip, that is, the semiconductor apparatus 100, itself, prior to the body bias optimization and the power gating repair through grouping according to the embodiments.

In the case where there is a physical defect of the semiconductor apparatus 100, itself, desired operation characteristics may not be obtained even if the body bias optimization and the power gating repair through grouping are performed. In this consideration, an example including a process of testing a physical defect of the semiconductor apparatus 100, itself, will be described below.

First, a low speed test is performed (S11).

The low speed test may be performed at a lower speed than the normal operation of the semiconductor apparatus 100, and may be performed in a state in which the first body bias V_p and the second body bias V_n are set to default values in the normal operation and the grouping enable signals EN<1:N> are also set to a default value in the normal operation.

An error occurrence check is performed (S12).

The error occurrence check of the step S12 may be a process of determining whether the test result data TOUT<1:N> corresponds to reference data.

While the test data TIN may have various patterns, it corresponds to a value that the tester 11 already knows. Therefore, in the case where an error has not occurred, the test result data TOUT<1:N> should correspond to the reference data which is set in advance to conform to a result of a scan test performed based on the test data TIN. According to this fact, it is possible to check whether an error has occurred or not.

If it is determined as a result of performing the error occurrence check of the step S12 that an error has occurred, determination is made as a physical defect of the test target chip (S13).

Conversely, if it is determined as a result of performing the error occurrence check of the step S12 that it is a pass, a normal speed test is performed (S14).

The normal speed test may be performed at an operation speed in the normal operation, and may be performed in a state in which the first body bias V_p and the second body bias V_n are set to minimum values and the grouping enable signals EN<1:N> are also set to a minimum value (for example, all signal bits=0).

Next, as the body bias optimization, the following steps S15 to S18 may be performed.

After the normal speed test of the step S14, an error occurrence check is performed (S15).

The error occurrence check of the step S15 may be performed the same as the above-described error occurrence check of the step S12.

If it is determined as a result of performing the error occurrence check of the step S15 that it is a pass, the first body bias V_p and the second body bias V_n are increased (S16), and an error occurrence check is performed again (S17).

The steps S16 and S17 are repeated until an error occurs.

If it is determined as a result of performing the error occurrence check of the step S17 that an error has occurred, the values of the first body bias V_p and the second body bias V_n at the time of a last pass are updated in the semiconductor apparatus 100 (S18).

This means that, in the case of controlling the power gating transistors 220, 221, 222 ~ and 230, 231, 232 ~ of FIG. 2 by the first body bias V_p and the second body bias V_n at the time when the error has occurred, the minimum timing margin of the plurality of logic circuit blocks 210, 211, 212, . . . has not been secured. Therefore, it is meant that the values of the first body bias value V_p and the second body bias V_n at the time of the last pass before the error occurs are values which may secure the minimum timing margin of the plurality of logic circuit blocks 210, 211, 212, . . . and at the same time may maximize operation current cutoff capability.

Then, as the power gating repair, the following steps S19 to S21 may be performed.

A normal speed test is performed (S19).

The normal speed test may be performed at an operation speed in the normal operation, and may be performed in a state in which the first body bias V_p and the second body bias V_n are set to minimum values and the grouping enable signals EN<1:N> are set to a maximum value (for example, all signal bits=1).

Whether an error has occurred is checked while changing the on/off combination of the plurality of switches 240 by adjusting the value of the grouping enable signals EN<1:N> through various combinations (adjusting the numbers and positions of switches 240 to be turned on/off), and, among the cases where an error has not occurred, a case of a smallest grouping is extracted (S20). The smallest grouping meant that the number of grouping members (switches 240 to be turned on) is smallest.

The error occurrence check of the step S20 may be performed the same as the above-described error occurrence check of the step S12.

The value of the grouping enable signals EN<1:N> extracted at the step S20 is updated in the semiconductor apparatus 100 (S21).

Thus, by controlling the plurality of switches 240 through using the grouping enable signals EN<1:N>, power gating may be repaired by grouping minimal logic circuit blocks at a level that ensures a stable operation.

While various embodiments have been described above, it will be understood to those skilled in the art that the embodiments described are examples only. Accordingly, the power gating control system and the control method thereof described herein should not be limited based on the described embodiments.

What is claimed is:

1. A power gating control system comprising:
a semiconductor apparatus including a logic circuit block which is coupled with a power supply terminal through a power gating transistor; and
a tester configured to control the semiconductor apparatus such that a test for the logic circuit block is performed by using test data while changing a body bias value of the power gating transistor, and update a body bias value satisfying a predetermined test condition, in the semiconductor apparatus.

2. The power gating control system according to claim 1, wherein the logic circuit block includes a plurality of logic circuits which are coupled in common with the power gating transistor.

3. The power gating control system according to claim 2, wherein the semiconductor apparatus further includes:
a plurality of scan-chains configured to perform a scan test for the test data via the plurality of logic circuits; and
a power gating controller configured to change the body bias by using a first code group stored in advance, in a test mode, and set the body bias by using a second code group updated by the tester, in a normal mode.

4. The power gating control system according to claim 3, wherein the power gating controller comprises:
a first storage section configured to store the first code group;
a second storage section configured to store the second code group;
a voltage generator configured to generate the body bias as a value depending on a body bias code; and
a control circuit configured to provide the first code group or the second code group as the body bias code to the voltage generator by determining the test mode and the normal mode.

5. A power gating control system comprising:
a semiconductor apparatus including a plurality of logic circuit blocks which are coupled with a power supply terminal through a plurality of power gating transistors, respectively, and a plurality of switches which are respectively coupled between coupling nodes of the plurality of power gating transistors and the plurality of logic circuit blocks; and
a tester configured to control the semiconductor apparatus such that a test for the plurality of logic circuit blocks is performed by using test data while performing at least one of an on and off (on/off) combination change of the plurality of switches and a body bias change of the plurality of power gating transistors, and update a first body bias value and a first on/off combination satisfying a predetermined test condition, in the semiconductor apparatus.

6. The power gating control system according to claim 5, wherein each of the plurality of logic circuit blocks includes a plurality of logic circuits which are coupled in common with each of the plurality of power gating transistors.

7. The power gating control system according to claim 6, wherein the semiconductor apparatus further includes:
a plurality of scan chains configured to perform a scan test for the test data via the plurality of logic circuit blocks; and
a power gating controller configured to change a body bias of the plurality of power gating transistors by using a first code group stored in advance and change an on/off combination of the plurality of switches, in a test mode, and set a body bias of the plurality of power gating transistors by using a second code group updated by the tester and control the plurality of switches to conform to the first on/off combination, in a normal mode.

8. The power gating control system according to claim 7, wherein the power gating controller comprises:
a first storage section configured to store the first code group;
a second storage section configured to store the second code group;

a voltage generator configured to generate the body bias as a value depending on a body bias code;

a grouping decoder configured to generate a plurality of grouping enable signals for controlling on/off of the plurality of switches depending on a grouping code; and a control circuit configured to provide a portion of any one of the first code group and the second code group as the body bias code to the voltage generator by determining the test mode and the normal mode, and provide a remainder as the grouping code to the grouping decoder.

9. A power gating control method of a semiconductor apparatus including a plurality of logic circuit blocks which are coupled with a power supply terminal through a plurality of power gating transistors, respectively, and a plurality of switches which are coupled between coupling nodes of the plurality of power gating transistors and the plurality of logic circuit blocks, the power gating control method comprising:

a body bias optimizing act of determining whether it is a pass or a fail (pass/fail), by performing a test for the plurality of logic circuit blocks while changing a body bias of the plurality of power gating transistors, and setting the body bias of the plurality of power gating transistors, to a body bias value at the time of a final pass.

10. The power gating control method according to claim 9, wherein the changing of the body bias is performed by sequentially increasing the body bias from a minimum value.

11. The power gating control method according to claim 9, further comprising:

determining whether it is a pass/fail, by performing a test for the plurality of logic circuit blocks while changing an on and off (on/off) combination of the plurality of switches, when a fail has occurred in the body bias optimizing act, and controlling the plurality of switches to an on/off combination in the case where a smallest number of switches are turned on among the plurality of switches.

* * * * *